(12) United States Patent
Hall et al.

(10) Patent No.: US 7,510,922 B2
(45) Date of Patent: Mar. 31, 2009

(54) SPACER T-GATE STRUCTURE FOR COSI$_2$ EXTENDIBILITY

(75) Inventors: Mark D. Hall, Austin, TX (US); Dharmesh Jawarani, Round Rock, TX (US); Mehul D. Shroff, Austin, TX (US); Edward O. Travis, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 71 days.

(21) Appl. No.: 11/339,953

(22) Filed: Jan. 26, 2006

(65) Prior Publication Data

US 2007/0173002 A1 Jul. 26, 2007

(51) Int. Cl.
*H01L 21/338* (2006.01)
*H01L 21/4763* (2006.01)

(52) U.S. Cl. .............................. 438/184; 257/E21.165; 257/E27.06

(58) Field of Classification Search .................. 438/197, 438/182, 184
See application file for complete search history.

(56) References Cited

U.S. PATENT DOCUMENTS

| | | | | |
|---|---|---|---|---|
| 4,868,617 A * | 9/1989 | Chiao et al. .................. 257/344 |
| 5,698,463 A * | 12/1997 | Suga .......................... 438/253 |
| 5,783,479 A * | 7/1998 | Lin et al. ..................... 438/592 |
| 5,904,517 A * | 5/1999 | Gardner et al. .............. 438/197 |
| 6,017,784 A * | 1/2000 | Ohta et al. ................... 438/197 |
| 6,043,545 A * | 3/2000 | Tseng et al. ................. 257/408 |
| 6,162,691 A * | 12/2000 | Huang ........................ 438/300 |
| 6,169,017 B1 * | 1/2001 | Lee ............................. 438/585 |
| 6,238,987 B1 * | 5/2001 | Lee ............................. 438/305 |
| 6,417,084 B1 | 7/2002 | Singh et al. ................. 438/585 |
| 6,448,163 B1 | 9/2002 | Holbrook et al. ............ 438/585 |
| 6,716,689 B2 * | 4/2004 | Bae et al. .................... 438/182 |
| 6,979,634 B2 * | 12/2005 | Suzuki ....................... 438/585 |
| 7,008,832 B1 * | 3/2006 | Subramanian et al. ...... 438/182 |
| 2004/0222182 A1 * | 11/2004 | Perng et al. .................... 216/13 |

* cited by examiner

*Primary Examiner*—W. David Coleman
*Assistant Examiner*—Shaka Scarlett
(74) *Attorney, Agent, or Firm*—Hamilton & Terrile, LLP; Michael Rocco Cannatti (57) ABSTRACT

A semiconductor process and apparatus provide a T-shaped structure (84) formed from a polysilicon structure (10) and polysilicon spacers (80, 82) and having a narrower bottom dimension (e.g., at or below 40 nm) and a larger top critical dimension (e.g., at or above 40 nm) so that a silicide may be formed from a first material (such as CoSi$_2$) in at least the upper region (100) of the T-shaped structure (84) without incurring the increased resistance caused by agglomeration and voiding that can occur with certain silicides at the smaller critical dimensions.

20 Claims, 5 Drawing Sheets

SPACER T-GATE STRUCTURE FOR COSI$_2$ EXTENDIBILITY

BACKGROUND OF THE INVENTION

1. Field of the Invention

The present invention is directed in general to the field of semiconductor devices. In one aspect, the present invention relates to the formation of silicided polysilicon features in semiconductor devices.

2. Description of the Related Art

As semiconductor device sizes are scaled down, the requirements for device design and fabrication continue to be tightened in order to fit more circuitry on smaller chips. One response to the higher density requirements is to use T-shaped gate structures having a narrower base area and a wider gate contact area. Examples of such T-shaped gate structures are described in U.S. Pat. Nos. 6,448,163 and 6,417,084. Among other disadvantages, such structures and the processes for making same use materials that provide insufficient conductivity and are not readily integrated with existing technologies without significant development and optimization costs.

Another solution for making smaller devices is to use improved silicide materials (such as cobalt silicide ($CoSi_2$)) in the formation of the polysilicon device features, such as gates and lines. However, such silicide materials exhibit degraded conductivity when the device widths shrink below certain dimensions. For example, $CoSi_2$ exhibits dramatically increased resistance at lateral poly dimensions below 40 nm where agglomeration and voiding occur. Attempts to overcome these performance limitations by using newer silicide materials, such as nickel silicide (NiSi), raise a variety of integration issues associated with such materials, such as NiSi encroachment and spiking.

Accordingly, a need exists for a semiconductor manufacturing process which provides closer packing density with ease of contacting the gate structures. There is also a need for a fabrication process which avoids performance limitations associated with existing silicide materials at smaller device geometries. In addition, there is a need for extending the usefulness of existing silicide materials to smaller device geometries. There is also a need for improved semiconductor processes and devices to overcome the problems in the art, such as outlined above. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings, in which.

DETAILED DESCRIPTION

A method and apparatus are described for fabricating a silicided polysilicon device feature, such as a gate or line, by creating a T-shaped polysilicon device feature with a larger top on which is formed a silicide layer, such as cobalt silicide ($CoSi_2$) or nickel silicide (NiSi). With this approach, a gate structure with a smaller bottom critical dimension (e.g., at or below 40 nm) is obtained, where the gate structure also has a larger top critical dimension (e.g., at or above 40 nm) so that a silicide material (such as $CoSi_2$) can be used without incurring the increased resistance caused by agglomeration and voiding that occur at the smaller critical dimensions. In an illustrative embodiment, the top portion of a polysilicon gate structure includes a polysilicon layer that is expanded prior to silicide formation by clearing the top and an upper portion of the sides of the polysilicon layer, depositing a polysilicon layer and then anisotropically etching the deposited polysilicon layer to leave poly sidewall spacers on the top of the polysilicon gate structure, thereby forming a T-shaped gate structure. With this structure, any desired silicide processing steps (e.g., depositing and annealing cobalt to form $CoSi_2$) may be used to complete the device, thereby minimizing the impact to the existing device architecture.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art.

Figure 1:
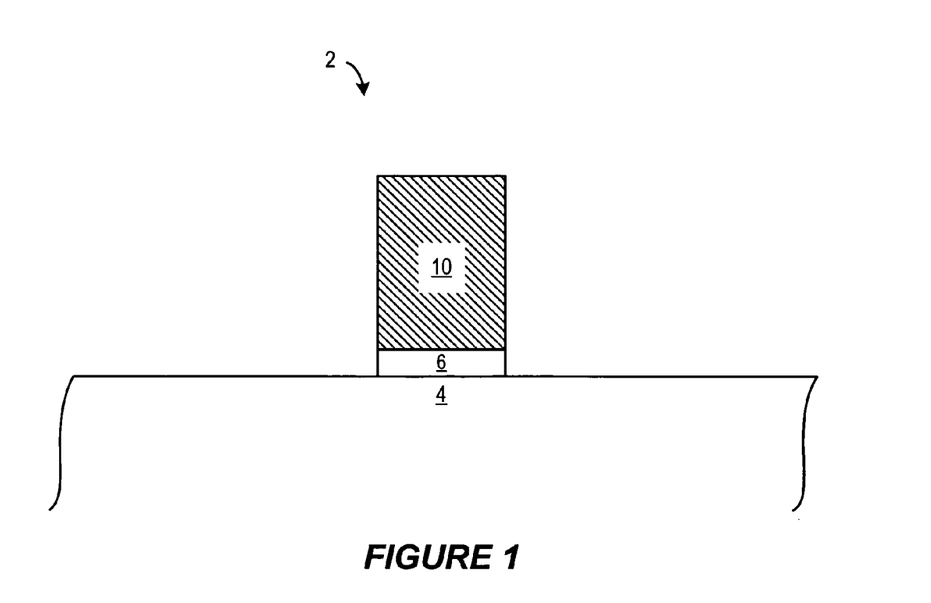
FIG. 1 is a partial cross-sectional view of a semiconductor structure including a substrate, a dielectric layer and an etched polysilicon gate structure.

Turning now to FIG. 1, a partial cross-sectional view is depicted of a semiconductor structure 2, including a substrate 4, a dielectric layer 6 and an etched polysilicon structure 10, such as a line or gate which defines a channel region in the substrate 4. Depending on the type of device being fabricated, the substrate 4 may be implemented as a bulk silicon substrate, single crystalline silicon (doped or undoped), or any semiconductor material including, for example, Si, SiC, SiGe, SiGeC, Ge, GaAs, InAs, InP as well as other Group III-IV compound semiconductors or any combination thereof, and may optionally be formed as the bulk handling wafer. In addition, the substrate 4 may be implemented as the top silicon layer of a silicon-on-insulator (SOI) structure. Prior to forming the etched polysilicon structure 10, an insulator or dielectric layer 6 is formed by depositing or growing an insulator or high-k dielectric (e.g., silicon dioxide, oxynitride, metal-oxide, nitride, etc.) over the semiconductor substrate 4 using chemical vapor deposition (CVD), plasma-enhanced chemical vapor deposition (PECVD), physical vapor deposition (PVD), atomic layer deposition (ALD), thermal oxidation, or any combination(s) of the above. However formed, the insulator or dielectric layer 6 may be formed to a thickness of approximately 5 to 200 angstroms when formed as the gate dielectric layer for a transistor, though other thicknesses may be used. As for the polysilicon structure 10, it may be formed by masking and etching one or more layers of deposited polycrystalline silicon or silicon germanium which are formed using CVD, PECVD, PVD, ALD, or any combination(s) thereof to a thickness of approximately 500-2000 Angstroms, though a thinner or thicker layer may also be used. In various implementations, the polysilicon structure 10 may be formed in part using epitaxial growth steps. Alternatively, amorphous or single crystal silicon may be used in place of polysilicon to form the structure 10. In addition or in the alternative, the polysilicon structure 10 may optionally include one or more conductive layers (e.g., metal, silicide complexes or the like). Any desired patterning and etch sequence may be used to form the etched polysilicon structure 10, including but not limited to photoresist or a hard mask formation, TEOS etch (using the photoresist as a mask), ARC etch (using the remnant TEOS as a mask), pre-etch cleaning, oxide break through, main poly plasma etch, soft landing etch, poly overetch, and/or post-etch cleaning.

As will be appreciated, the polysilicon structure 10 may be used to form a gate electrode in a transistor device. However, the polysilicon structure 10 may also be used to form non-volatile memory devices, such as floating gate devices, nanocluster devices and SONOS (silicon-oxide-nitride-oxide-silicon) devices. With such applications, the polysilicon structure 10 is implemented with different types of materials or structures, such as a plurality of nanoclusters or nanocrystals (i.e. discrete storage elements), such as in the case of a nanocrystal NVM device, or some other material for conducting and storing charge. The polysilicon structure 10 may also include a nitride layer (not shown) which is subsequently used to provide a charge storage function in accordance with various non-volatile memory embodiments.

Figure 2:
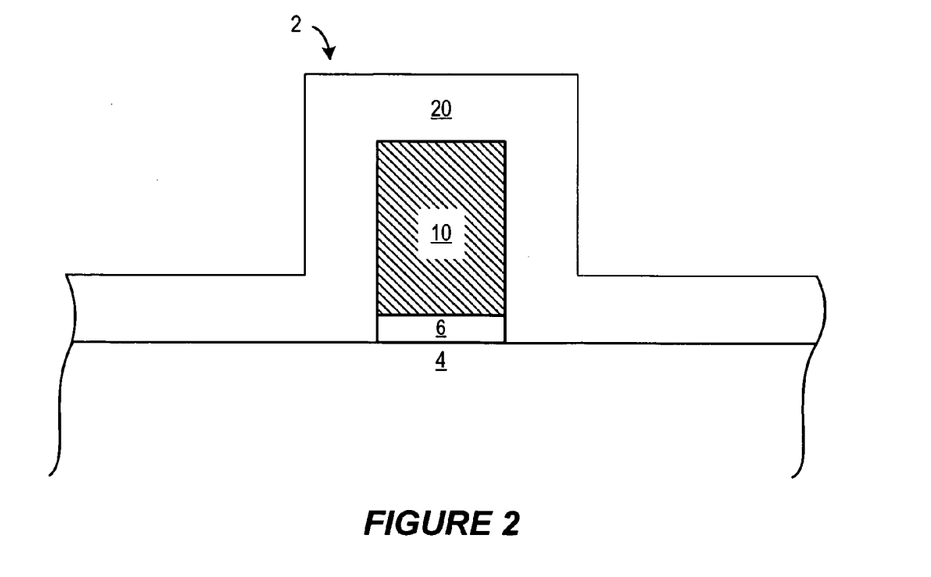
FIG. 2 illustrates processing subsequent to FIG. 1 after formation of a spacer liner oxide over the semiconductor structure.

FIG. 2 illustrates processing subsequent to FIG. 1 after formation of a spacer liner oxide 20 over the semiconductor structure 2. Though the spacer liner oxide 20 may be formed by thermal re-oxidation of the exposed surfaces of the polysilicon structure 10 and the substrate surface 4, in a selected embodiment, a thin layer (approximately 100 Å) of protective oxide is deposited on the surface of the polysilicon structure 10 and the exposed substrate 4 using any desired oxide deposition process. It will be appreciated that the spacer liner oxide 20 is generally formed subsequent to the formation of extension/halo regions by ion implantation. Of course, such implantation need not be performed if, in accordance with the design of the device, halo or extension regions are not required.

Figure 3:
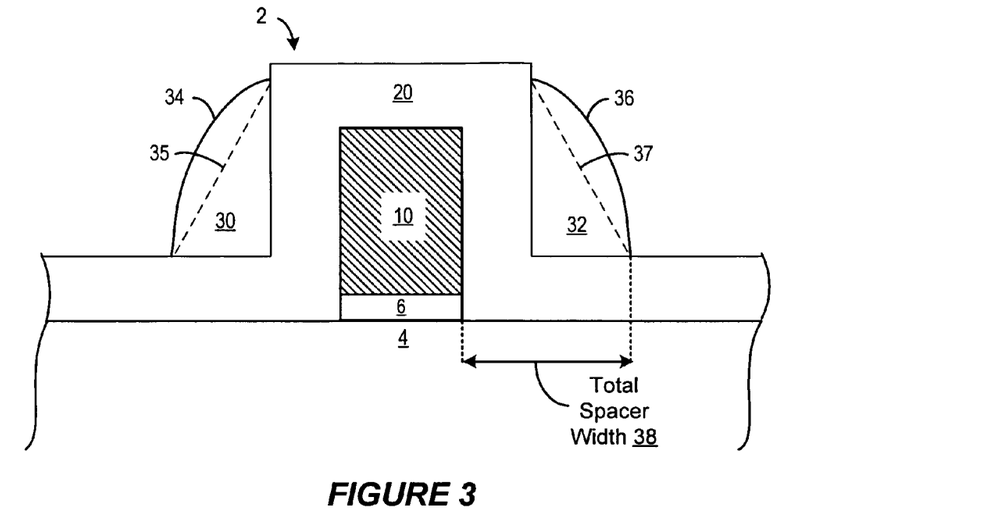
FIG. 3 illustrates processing subsequent to FIG. 2 after formation of sidewall spacers.

FIG. 3 illustrates processing of the semiconductor structure 2 subsequent to FIG. 2 after formation of sidewall spacers 30, 32. The spacers 30, 32 may be formed by depositing a relatively thick dielectric layer (e.g., over 500 Å of nitride) over the spacer liner oxide 20 using any desired deposition process, and then anisotropically etching the deposited dielectric layer to form the sidewall spacers 30, 32. Depending on the constituent materials and dimensions of the deposited dielectric layer(s), the etching may use one or more anisotropic etch processes to form sidewall spacers 30, 32, including a dry etching process, such as reactive-ion etching, ion beam etching, plasma etching, laser etching, or any combination thereof. In a selected illustrative embodiment, the sidewall spacers 30, 32 are formed by depositing and etching a layer of nitride, where the processing details for the nitride deposition and etching steps are selected to provide a gently curved profile (as indicated at curved lines 34, 36) or even a linear profile (as indicated at dashed lines 35, 37) for the nitride sidewall spacers 30, 32 for purposes of facilitating removal of the subsequently deposited polysilicon, as described further below. In addition, the sidewall spacer processing details may be selected to obtain on each side a minimum predetermined total spacer width 38 (e.g., approximately 500-1000 Å) which is the combination of the spacer liner oxide 20 and the bottom width of the nitride sidewall spacer (e.g., 32). As illustrated in the figures, the sidewall spacers 30, 32 (as well as any underlying spacer liner oxide) may be formed on two opposing sides of the etched polysilicon structure 10, but it will be appreciated that the sidewall spacers 30, 32 (as well as any underlying spacer liner oxide) may be formed on any one or more or all of the sides of the etched polysilicon structure 10. It will also be appreciated that a spacer or sidewall spacer may be formed from one or more dielectric layers on each side of an etched polysilicon or gate structure by forming physically separate spacers on each side or by forming a single spacer at one or more peripheral sidewalls of the etched polysilicon structure 10.

Figure 4:
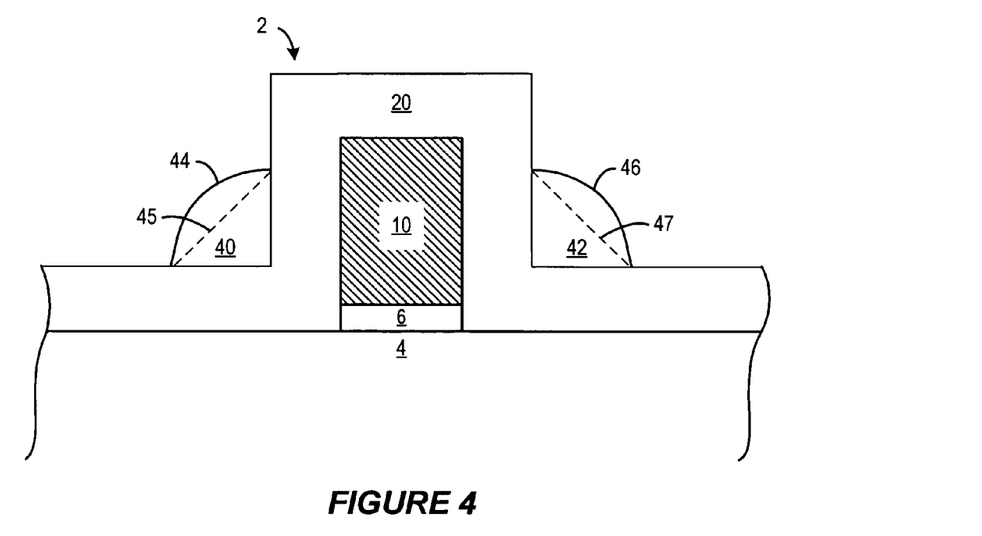
FIG. 4 illustrates processing subsequent to FIG. 3 after the spacers are partially recessed.

FIG. 4 illustrates processing of the semiconductor structure 2 subsequent to FIG. 3 after the sidewall spacers 30, 32 are partially etched to form recessed sidewall spacers 40, 42. By using a selective etchant process that is selective to oxide (such as a nitride dry etch chemistry), the spacer liner oxide layer 20 substantially remains, while the nitride sidewall spacers 30, 32 are recessed to a height that is less than the height of the polysilicon structure 10. In various embodiments, the sidewall spacer processing details are selected to obtain a linear profile (as indicated at dashed lines 45, 47) for the recessed sidewall spacers 40, 42, though a gently curved profile (as indicated at curved lines 44, 46) may also be used.

Figure 5:
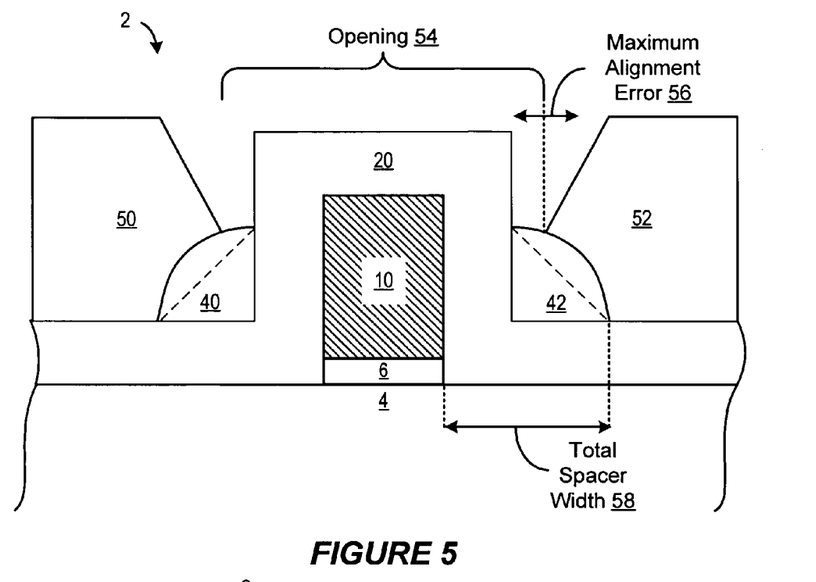
FIG. 5 illustrates processing subsequent to FIG. 4 after a mask or photoresist layer is formed having an opening formed in alignment with the recessed spacers to expose a portion of the spacer liner oxide over the polysilicon gate structure.

FIG. 5 illustrates processing of the semiconductor structure 2 subsequent to FIG. 4 after a patterned mask or photoresist layer 50, 52 is formed having an opening 54 formed in alignment with the recessed spacers 40, 42 to expose a portion of the spacer liner oxide 20 over the polysilicon structure 10. While any desired masking, patterning and etching steps may be used, in a selected illustrative embodiment, a layer of photoresist coat (e.g., approximately 1400-3000 Å) may be applied over the semiconductor structure 2, though an organic anti-reflective coating (ARC) layer or soluble bottom anti-reflective coating (BARC) layer may also be used. In addition, a selected embodiment uses a negative resist in combination with the existing gate mask to form the opening 54 in the resist coating, thereby eliminating the need for an extra mask and its associated cost. To prevent unwanted spacer liner oxide on top of the polysilicon or etched spacer liner oxide on top of the source/drain region, the alignment capability 56 of any stepper machinery used to pattern the resist coating should be less than half the predetermined total spacer width 58. For example, with the total spacer width of 60 nm on each side, the maximum alignment error should be less than 30 nm per side. As will be appreciated by those skilled in the art, such alignment control can be accomplished with a 193-nm stepper or better, resulting in a maximum error of less than 25 nm for overlaying the gate mask for use in etching the resist.

Figure 6:
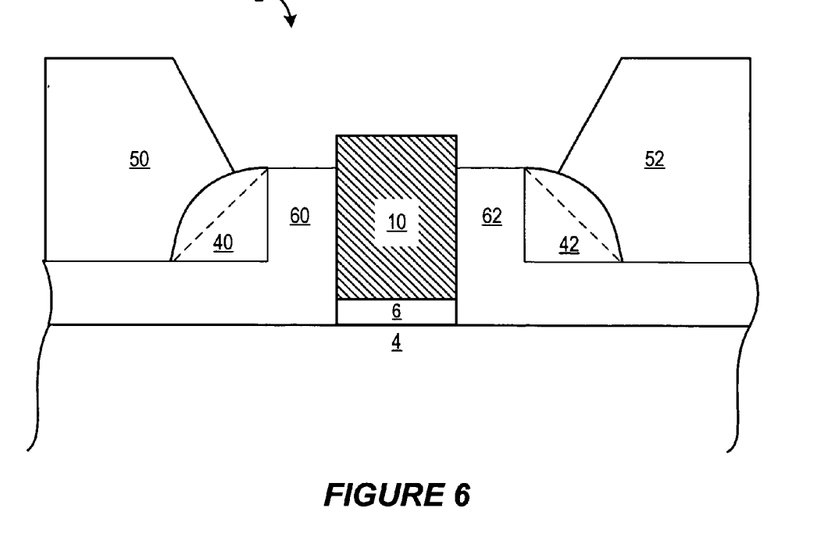
FIG. 6 illustrates processing subsequent to FIG. 5 after the exposed spacer liner oxide is etched to clear the top and part of the sides of the polysilicon gate structure.

FIG. 6 illustrates processing of the semiconductor structure 2 subsequent to FIG. 5 after the exposed spacer liner oxide 20 (depicted in FIG. 5) is selectively etched to clear the top and part of the sides of the polysilicon structure 10. By using an etchant that is selective to nitride, the spacer liner oxide layer 20 is cleared from at least the top of the polysilicon structure 10, leaving remnant spacer liner oxide layers 60, 62. As depicted, the remnant spacer liner oxide layers 60, 62 are recessed to a height that is less than the height of the polysilicon structure 10, and in a selected embodiment, are recessed to substantially the same height as the recessed sidewall spacers 40, 42. After the resist 50, 52 is stripped, additional spacer liner oxide from the top and/or sidewalls of the polysilicon structure 10 may be removed by applying a short HF etch which increases the contact area for the second polysilicon layer (described below), but leaves a spacer liner oxide layer over the source/drain regions of the substrate 4.

As will be appreciated, other techniques may be used to expose the tops of the polysilicon structure 10. For example, a chemical mechanical polishing (CMP) step may be used to expose the tops of the polysilicon gate structures 10 by forming a layer of resist, performing a CMP on the resist layer, and then performing an oxide etchback to expose the top of the polysilicon gate structure 10.

Another option is to use an ultra-low viscosity (planarizing) resist with a timed ash followed by an oxide etch. In contrast to using a photo step, the use of an ultra-low viscosity resist does not expose the planarizing resist with a stepper. By using an ultra-low viscosity resist that is fairly flat on the wafer and over the topography, a timed $O_2$ ash may instead be used to remove the resist and expose the top and upper sidewall portions of the poly. The resulting process is self-aligning to the poly gates. The planarizing effect of such low viscosity resists may not work well on wide poly lines (e.g., the resist keeps its full thickness on top of a wide poly feature), resulting in exposed narrow poly features that could be used to form a T-gate, but unexposed wide poly features that could not be used to form a T-gate. However, since silicide does not have a problem on wide poly, the lack of a T-gate on wide poly would not be a problem. To address the foregoing, the fabrication process would include an exposure step after the ash for gates below a certain dimension, but for gates above a certain dimension, there would be no exposure step.

Figure 7:
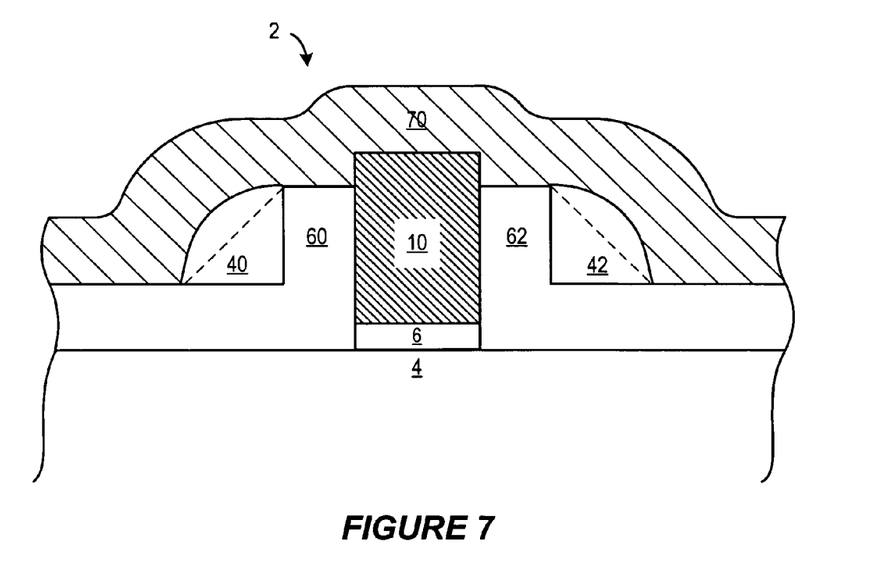
FIG. 7 illustrates processing subsequent to FIG. 6 after formation of a polysilicon layer over the semiconductor structure.

FIG. 7 illustrates processing of the semiconductor structure 2 subsequent to FIG. 6 after formation of a polysilicon layer 70 over the semiconductor structure 2. The polysilicon layer 70 may be formed from doped or undoped polysilicon that is blanket-deposited using CVD, PECVD, PVD, ALD, or any combination(s) thereof. For example, in an illustrative implementation, a second layer 70 of polysilicon is deposited conformally over the semiconductor structure 2 to a thickness of approximately 150-250 Angstroms, though a thicker or thinner layer may also be used. By conformally depositing the polysilicon layer 70 over the polysilicon structure 10, sidewall spacers and exposed substrate, a substantially uniform thickness of polysilicon is obtained that completely covers the exposed top and sides of the polysilicon structure 10.

Figure 8:
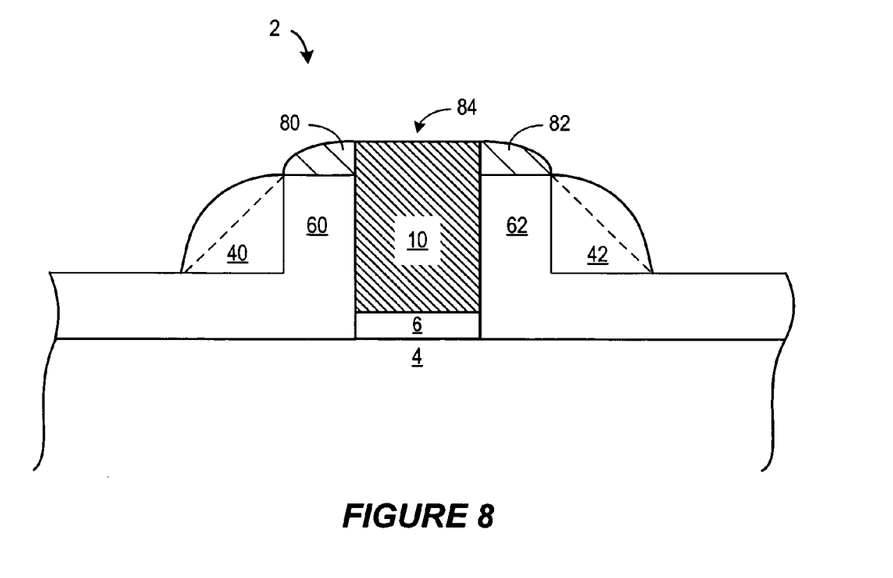
FIG. 8 illustrates processing subsequent to FIG. 7 after the polysilicon layer is etched to form polysilicon spacers on the top of the polysilicon gate structure.

Next, the polysilicon layer 70 is selectively etched to form polysilicon spacers 80, 82 on the top of the polysilicon structure 10, as illustrated in FIG. 8. While any desired patterning and etch sequence may be used to form the polysilicon spacers 80, 82, an anisotropic etch process may be used to form spacers 80, 82 that provide an extra width (e.g., approximately 10 nm wide on each side) at the top of the polysilicon gate structure 10, while the original width at the bottom of the polysilicon gate structure 10 (e.g., 40 nm or less) is maintained. For example, a plasma etch process (such as F or HBr plasmas) may be used to anisotropically etch the polysilicon layer 70. As will be appreciated, by controlling the predetermined total spacer width and the alignment capability of the resist patterning step, the edges of the polysilicon spacers 80, 82 will terminate at or before the recessed nitride spacers 40, 42 so that there is no shorting between gate 10 and the source/drain regions in the substrate 4 (when the polysilicon structure 10 is used as a transistor gate).

After formation of the polysilicon spacers 80, 82 on the polysilicon structure 10, the resulting T-shaped gate structure 84 may be processed using any desired silicide formation steps to form a silicide layer (such as $CoSi_2$ or NiSi) on at least the T-shaped gate structure 84. Of course, a T-gate or T-shaped structure may include any shape formed with the techniques disclosed herein that have wider top critical dimensions, including but not limited to Y-shaped structures, F-shaped structures, V-shaped structures, and the like. With the gate structure being formed just prior to the silicide formation, existing silicide formation processes may be used to form silicide on the wider upper region of the T-shaped gate structure that would not otherwise be feasible with a narrower gate structure. Thus, the gate structure with a wider upper surface allows existing silicide formation steps to be used in a straightforward way that requires minimal optimization or change to the existing transistor architecture. For example, $CoSi_2$ may be formed on the top of a T-shaped gate structure having a width of at least 45 nm without incurring the performance degradation that would occur if the same silicide were formed on a gate structure having a width of 40 nm or less. In addition, selected embodiments of the present invention may also be used on 90 nm technologies and beyond, including with NiSi processes which form silicide regions in smaller devices, or this technology can be retroactively applied to extend TiSi processes that use gate lengths of larger dimensions such as 0.18 microns but face the issues of agglomeration and voiding on narrower linewidths.

Figure 9:
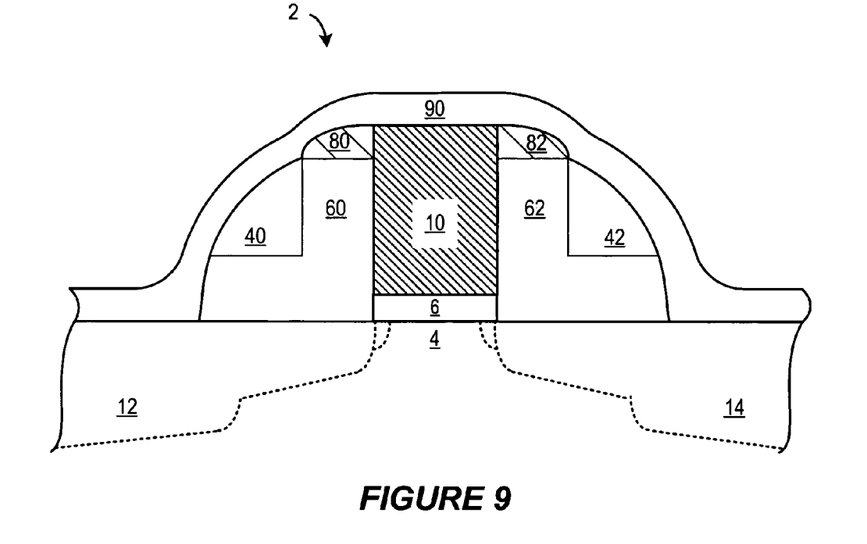
FIG. 9 illustrates processing subsequent to FIG. 8 after a metal layer is formed over the semiconductor structure.

An example sequence of silicide formation steps is depicted beginning with FIG. 9, which illustrates processing of the semiconductor structure 2 subsequent to FIG. 8 after a conductive or metal layer 90 (e.g., cobalt or nickel) is formed over the semiconductor structure 2. In an illustrative implementation, the metal layer 90 may be formed by depositing or sputtering one or more layers of conductive material (such as cobalt) to a thickness of approximately 70-90 Angstroms, though a thinner or thicker layer may also be used. Other conductive materials, such as nickel, may also be formed or sputtered. As depicted, the deposited layer 90 covers the entirety of the semiconductor structure 2.

Figure 10:
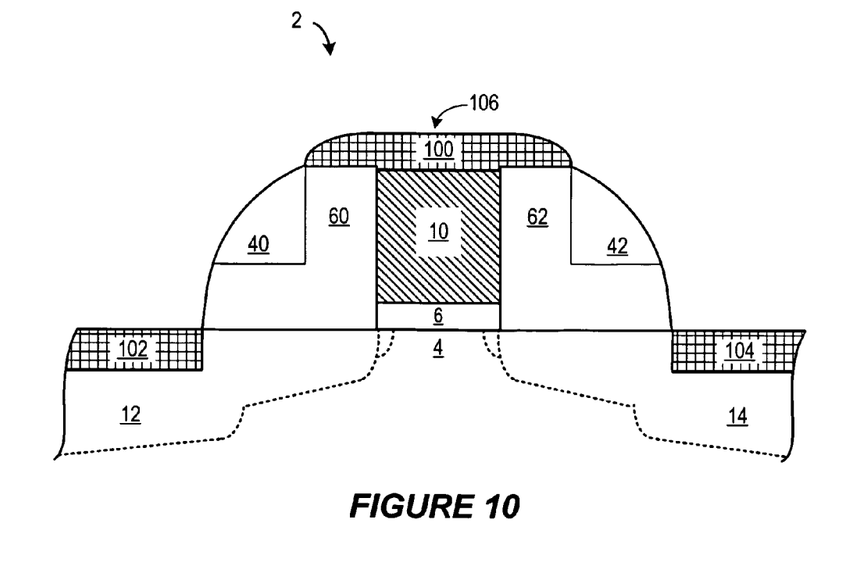
FIG. 10 illustrates processing subsequent to FIG. 9 after the metal layer reacts with at least the polysilicon on the top of the polysilicon gate structure to form silicided T-shaped polysilicon gate structure It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

FIG. 10 illustrates processing of the semiconductor structure 2 subsequent to FIG. 9 after the metal layer 90 reacts with at least the polysilicon on the top of the polysilicon structure 10 and the polysilicon spacers 80, 82 to form a silicided layer 100 on at least the top of T-shaped polysilicon structure 106. In an illustrative embodiment, the reaction of the metal layer 90 and polysilicon is promoted by performing an initial rapid thermal anneal step (e.g., 400-600° C.), followed by a Piranha clean step to remove the metal from the exposed surfaces of the sidewall spacers 40, 60, 42, 62, and then followed by a second rapid thermal anneal step (e.g., 650-850° C.). The timing and temperature of the initial rapid thermal anneal step are selected so that the metal layer 90 reacts with the exposed surfaces of the polysilicon 10, 80, 82 and substrate 4, but not with the sidewall spacer material 40, 60, 42, 62. As a result, reacted silicide regions 100, 102, 104 may be formed after the initial rapid thermal anneal step on the exposed surfaces of the polysilicon 10, 80, 82 and substrate 4. After the Piranha clean step, the timing and temperature of the second rapid thermal anneal step are selected so that the reacted silicide 100, 102, 104 is pushed into a low resistivity phase.

It will be appreciated that additional processing steps will be used to complete the fabrication of the semiconductor structures into functioning transistors or devices. As examples, one or more sacrificial oxide formation, stripping, isolation region formation, extension implant, halo implant, spacer formation, source/drain implant, heat drive or anneal steps, and polishing steps may be performed, along with conventional backend processing (not depicted), typically including formation of multiple levels of interconnect that are used to connect the transistors in a desired manner to achieve the desired functionality. For example, the source/drain regions 12, 14 depicted in FIG. 10 may be formed before, during and/or after the formation of the T-shaped polysilicon structure 106. Thus, the specific sequence of steps used to complete the fabrication of the semiconductor structures may vary, depending on the process and/or design requirements.

In one form, there is provided herein a method for fabricating a semiconductor device by forming a first insulating layer over a semiconductor substrate, forming a T-shaped polysilicon structure on the first insulating layer and then forming silicide (e.g., cobalt silicide or nickel silicide) in an upper region of the T-shaped polysilicon structure, which may be used as a line or gate electrode. To this end, the T-shaped polysilicon structure is constructed by forming an etched polysilicon structure having a first base width (e.g., 40 nm or less) over the first insulating layer. Next, a spacer having a predetermined total spacer width is formed on each side of the etched polysilicon structure. In a selected embodiment, the spacer is formed by depositing a spacer liner oxide on the top and side surfaces of the etched polysilicon structure, and then forming nitride sidewall spacers on the spacer liner oxide. Next, any spacer material is removed from the top surface and an upper portion of a sidewall surface of the etched polysilicon structure. This may be accomplished by recessing the nitride sidewall spacers, patterning a layer of resist using a gate mask stepper having an alignment capability that is less than half the predetermined total spacer width to form an opening over the etched polysilicon structure and/or clearing the spacer liner oxide from at least the top and an upper part of the side surfaces of the etched polysilicon structure. In a selected embodiment, the spacers are removed by applying a resist coating to the semiconductor device, forming an opening in the resist coating that is aligned with the spacers to expose any spacer material formed over the polysilicon structure and then selectively removing any spacer material from the top surface of the etched polysilicon structure and from an upper portion of a sidewall surface of the etched polysilicon structure. Alternatively, a polish step may be used. Next, a polysilicon layer is deposited in contact with the exposed surface(s) of the etched polysilicon structure, and then anisotropically etched to form polysilicon spacers on an upper sidewall surface of the etched polysilicon structure. The resulting T-shaped polysilicon structure has an upper region with a second width (e.g., 40 nm or more) that is wider than the first base width.

In another form, there is provided a method for forming a T-gate electrode. Under the method, an etched gate structure having an upper polysilicon layer is formed over a gate dielectric layer. Sidewall spacers may the be formed on the side of the etched gate structure, such as by forming one or more dielectric layers over top and side surfaces of the etched gate structure and then removing (e.g., recessing) the dielectric layer(s) from a top surface and an upper portion of a sidewall surface of the etched gate structure. In addition or in the alternative, a resist layer may be formed and selectively etched or polished to clear the top surface of the etched gate structure. After sidewall spacers are formed on each side of the etched gate structure, a polysilicon layer is formed in contact with at least any exposed surface of the upper polysilicon layer. By anisotropically etching the deposited polysilicon layer, polysilicon spacers are formed on an upper sidewall surface of said etched gate structure, thereby forming a T-gate electrode having a wider upper region and a narrower base region. Finally, a silicide (e.g., cobalt silicide or nickel silicide) may be formed in the wider upper region of the T-gate.

In yet another form, there is provided method for fabricating a polysilicon structure having a wider upper structure and a narrower base structure. After forming an etched polysilicon base structure over a dielectric layer, sidewall spacers are then formed on each side of the etched polysilicon base structure so that a top surface and an upper portion of a sidewall surface of the etched polysilicon base structure are cleared. Next, a polysilicon layer is deposited over the etched polysilicon base structure in contact with any exposed surface of the etched polysilicon base structure. The deposited polysilicon layer is then anisotropically etched to form poly sidewall spacers which, in combination with the upper region of the etched polysilicon base structure, form the wider upper structure. With the wider upper structure fabricated, silicide regions may be formed therein.

Although the described exemplary embodiments disclosed herein are directed to various semiconductor device structures and methods for making same, the present invention is not necessarily limited to the example embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, the depicted transistor structures may also be formed in a well region (not shown) of the substrate which may be an n-doped well or a p-doped well. Also, the various silicon-based constituent layers may be formed with different conductive materials than those disclosed. In addition, the source and drains and extensions may be p-type or n-type, depending on the polarity of the underlying substrate or well region, in order to form either p-type or n-type semiconductor devices. Moreover, the thickness of the described layers may deviate from the disclosed thickness values, and any specified etch chemistries are provided for illustration purposes only. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a semiconductor device, comprising:
   providing a substrate;
   forming a first insulating layer over the substrate;
   forming an etched polysilicon base structure over the first insulating layer, said etched polysilicon base structure having a first base width;
   forming a spacer on at least one side of the etched polysilicon base structure having a total spacer width;
   applying a photoresist layer over the etched polysilicon base structure and spacer;
   forming an opening in the photoresist layer in alignment to overlap with the spacer to expose only a portion of the spacer to form a photoresist etch mask;
   removing part of the spacer that is formed on at least one side of the etched polysilicon base structure from the upper sidewall surface of said etched polysilicon base structure using the photoresist etch mask;
   removing the photoresist etch mask;
   depositing a polysilicon layer in contact with at least any exposed surface of the etched polysilicon base structure;
   anisotropically etching said polysilicon layer to form a polysilicon spacer on an upper sidewall surface of said etched polysilicon base structure, thereby forming a polysilicon structure having an upper region with a second width that is wider than the first base width; and
   forming silicide in the upper region of the polysilicon structure.

2. The method of claim 1, where the step of forming silicide comprises forming cobalt silicide in the upper region of the polysilicon structure.

3. The method of claim 1, where the step of forming silicide comprises forming nickel silicide in the upper region of the polysilicon structure.

4. The method of claim 1, where the polysilicon structure comprises a polysilicon line or gate electrode.

5. The method of claim 1, where the first base width is 40 nm or less, and where the second width is 40 nm or more.

6. The method of claim 1, where forming a spacer on at least one side of the etched polysilicon base structure comprises:
   forming a spacer liner oxide on top and side surfaces of the etched polysilicon base structure;
   forming nitride sidewall spacers on the spacer liner oxide; and
   where removing part of the spacer comprises removing any spacer material from a top surface of the etched polysilicon base structure and from an upper portion of a sidewall surface of the etched polysilicon base structure prior to depositing the polysilicon layer.

7. The method of claim 6, where the step of removing spacer material comprises recessing the nitride sidewall spacers.

8. The method of claim 6, where the step of removing spacer material comprises clearing spacer liner oxide from at least the top and an upper part of the side surfaces of the etched polysilicon base structure.

9. The method of claim 1, where removing part of the spacer comprises removing any spacer material from a top surface of the etched polysilicon base structure and from an upper portion of a sidewall surface of the etched polysilicon base structure prior to depositing the polysilicon layer.

10. The method of claim 1, where forming an opening in the photoresist layer comprises patterning an opening in the photoresist layer using a gate mask stepper having an alignment capability that is less than half the total spacer width.

11. The method of claim 1, where removing part of the spacer comprises:
   using the photoresist etch mask to selectively remove any spacer material from a top surface of the etched polysilicon base structure and from an upper portion of a sidewall surface of the etched polysilicon base structure.

12. The method of claim 1, further comprising polishing any spacer material from at least a top surface of the etched polysilicon base structure using a CMP process prior to depositing the polysilicon layer.

13. The method of claim 1, where
   applying a photoresist layer comprises applying an ultra-low viscosity planarizing resist coating to the semiconductor device; and where forming an opening in the photoresist layer comprises
   using a timed ash to remove the planarizing resist from above the etched polysilicon base structure and to leave a resist mask protecting other areas of the semiconductor device.

14. A method for forming a T-gate electrode, comprising:
   forming an etched gate structure over a gate dielectric layer, said gate structure comprising a polysilicon layer;
   forming a sidewall spacer on one or more sides of the etched gate structure;
   applying a photoresist layer over the etched gate structure and sidewall spacer;
   forming an opening in the photoresist layer in alignment to overlap with the sidewall spacer to expose only a portion of the sidewall spacer to form a photoresist etch mask;
   removing part of the sidewall spacer that is formed on at least one side of the etched gate structure from the upper sidewall surface of said etched gate structure using the photoresist etch mask;
   removing the photoresist etch mask;
   depositing a first polysilicon layer in contact with at least any exposed surface of the polysilicon layer in the etched gate structure;
   anisotropically etching said first polysilicon layer to form a polysilicon spacer on an upper sidewall surface of said etched gate structure, thereby forming a T-gate electrode having a wider upper region and a narrower base region.

15. The method of claim 14, further comprising forming silicide in an upper region of the T-gate electrode.

16. The method of claim 15, where the silicide comprises cobalt silicide or nickel silicide.

17. The method of claim 14, where forming a sidewall spacer comprises:
   forming one or more dielectric layers over top and side surfaces of the etched gate structure; and where removing part of the sidewall spacer comprises removing the one or more dielectric layers from a top surface of the etched gate structure and from an upper portion of a sidewall surface of the etched gate structure prior to depositing the first polysilicon layer.

18. The method of claim 17, where removing the one or more dielectric layers comprises recessing said one or more dielectric layers to clear at least the top surface of the etched gate structure.

19. The method of claim 17, where removing the one or more dielectric layers comprises applying a chemical mechanical polish process to clear at least the top surface of the etched gate structure.

20. A method for fabricating a polysilicon structure having a wider upper structure and a narrower base structure, comprising:

forming an etched polysilicon base structure over a dielectric layer;

forming a spacer on at least one side of the etched polysilicon base structure;

applying a photoresist layer over the etched polysilicon base structure and spacer;

forming an opening in the photoresist layer in alignment to overlap with the spacer to expose only a portion of the spacer to form a photoresist etch mask;

forming a sidewall spacer on each side of the etched polysilicon base structure using the photoresist etch mask to selectively etch the spacer so that a top surface and an upper portion of a sidewall surface of the etched polysilicon base structure are cleared;

depositing a first polysilicon layer over the etched polysilicon base structure in contact with at least any exposed surface of the etched polysilicon base structure; and anisotropically etching the first polysilicon layer to form poly sidewall spacers, said poly sidewall spacers and an upper region of the etched polysilicon base structure forming the wider upper structure.

* * * * *